(12) United States Patent
Horie

(10) Patent No.: US 11,817,246 B2
(45) Date of Patent: Nov. 14, 2023

(54) WIRE-WOUND COIL COMPONENT AND DRUM CORE

(71) Applicant: TAIYO YUDEN CO., LTD., Tokyo (JP)

(72) Inventor: Katsuyuki Horie, Tokyo (JP)

(73) Assignee: Taiyo Yuden Co., Ltd., Tokyo (JP)

(*) Notice: Subject to any disclaimer, the term of this patent is extended or adjusted under 35 U.S.C. 154(b) by 894 days.

(21) Appl. No.: 16/722,957

(22) Filed: Dec. 20, 2019

(65) Prior Publication Data

US 2020/0211753 A1 Jul. 2, 2020

(30) Foreign Application Priority Data

Dec. 28, 2018 (JP) .................................. 2018-246568

(51) Int. Cl.
  *H01F 17/04* (2006.01)
  *H01F 27/29* (2006.01)
  (Continued)

(52) U.S. Cl.
  CPC ......... *H01F 17/045* (2013.01); *H01F 27/027* (2013.01); *H01F 27/292* (2013.01);
  (Continued)

(58) Field of Classification Search
  CPC .... H01F 17/045; H01F 27/027; H01F 27/292; H01F 27/30
  (Continued)

(56) References Cited

U.S. PATENT DOCUMENTS 8,471,663 B2 * 6/2013 Cho ..................... H01F 27/2823
                                                    336/182
8,937,522 B2 * 1/2015 Lai ........................... H01F 27/29
                                                    336/212
(Continued)

FOREIGN PATENT DOCUMENTS

JP     09320855 A   * 12/1997
JP     10275728 A   * 10/1998
(Continued)

OTHER PUBLICATIONS

Notice of Reasons for Refusal dated Oct. 18, 2022, issued in corresponding Japanese Patent Application No. 2018-246568 with English translation (10 pgs.).
(Continued)

*Primary Examiner* — Marlon T Fletcher
*Assistant Examiner* — Joselito S. Baisa
(74) *Attorney, Agent, or Firm* — Pillsbury Winthrop Shaw Pittman, LLP

(57) ABSTRACT

One object of the present invention is to provide a wire-wound coil component and a drum core that can be manufactured easily and less affected by an inter-wire capacitance. A coil component includes: a drum core having a winding core extending along a front-rear direction and a first flange provided on a front end of the winding core; a first conductor wire wound around the winding core of the drum core; and a second conductor wire wound on an outer side of the first conductor wire in a direction orthogonal to the front-rear direction, wherein turns of a same number of the first conductor wire and the second conductor wire contact with each other, while turns of different numbers of the first conductor wire and the second conductor wire are separated from each other.

11 Claims, 11 Drawing Sheets

(51) Int. Cl.
*H01F 27/30* (2006.01)
*H01F 17/00* (2006.01)
*H01F 27/02* (2006.01)
*H03H 7/09* (2006.01)

(52) U.S. Cl.
CPC .............. *H01F 27/30* (2013.01); *H03H 7/09* (2013.01); *H01F 2017/0093* (2013.01)

(58) Field of Classification Search
USPC ......................................................... 336/192
See application file for complete search history.

(56) References Cited

U.S. PATENT DOCUMENTS

| | | | | |
|---|---|---|---|---|
| 9,305,695 | B2* | 4/2016 | Karasek | ................ H01F 17/045 |
| 9,536,648 | B2* | 1/2017 | Yamaguchi | ............... H01F 5/02 |
| 10,645,811 | B2* | 5/2020 | Dinh | ..................... H01F 27/306 |
| 10,692,639 | B2* | 6/2020 | Jerez | ..................... H01F 41/076 |
| 2008/0309445 | A1* | 12/2008 | Suzuki | .................. H01F 41/069 |
| | | | | 336/183 |
| 2009/0045902 | A1* | 2/2009 | Hirai | ..................... H01F 17/045 |
| | | | | 29/605 |
| 2009/0219127 | A1* | 9/2009 | Tomonari | ................ H01F 27/29 |
| | | | | 336/192 |
| 2010/0109827 | A1* | 5/2010 | Asou | ..................... H01F 41/076 |
| | | | | 29/605 |
| 2013/0186995 | A1* | 7/2013 | Yamaguchi | ........... H01F 17/045 |
| | | | | 242/432.6 |
| 2014/0097928 | A1* | 4/2014 | Tomonari | .............. H01F 17/045 |
| | | | | 336/207 |
| 2016/0118183 | A1 | 4/2016 | Wada | |
| 2016/0155561 | A1* | 6/2016 | Takagi | ................. H01F 17/045 |
| | | | | 336/222 |
| 2017/0025212 | A1 | 1/2017 | Jerez et al. | |
| 2019/0331872 | A1* | 10/2019 | Okada | ................... C03B 37/032 |

FOREIGN PATENT DOCUMENTS

| | | |
|---|---|---|
| JP | 2010-226024 A | 10/2010 |
| JP | 2014-120730 A | 6/2014 |
| JP | 2014-199904 A | 10/2014 |
| JP | 2017-508298 A | 3/2017 |
| JP | 2017-093115 A | 5/2017 |
| JP | 2019186415 A * | 10/2019 ........... H01F 17/045 |

OTHER PUBLICATIONS

Notification of First Office Action dated Jan. 19, 2023 issued in corresponding Chinese Patent Application No. 201911354227.5, with English translation (16 pgs.).

\* cited by examiner

WIRE-WOUND COIL COMPONENT AND DRUM CORE

CROSS-REFERENCE TO RELATED APPLICATIONS

This application is based on and claims the benefit of priority from Japanese Patent Application Serial No. 2018-246568 (filed on Dec. 28, 2018), the contents of which are hereby incorporated by reference in their entirety.

TECHNICAL FIELD

The present invention relates to a wire-wound coil component and a drum core.

BACKGROUND

A wire-wound coil component has conventionally been known. A wire-wound coil component includes a drum core, a winding wound around the drum core, and a plurality of external electrodes electrically connected to ends of the winding. The drum core includes a pair of flanges and a winding core that connects the pair of flanges to each other. The winding is wound around the winding core. Between the pair of flanges, there is formed a resin layer so as to cover the winding wound around the winding core.

One example of wire-wound coil component is a common mode choke coil for eliminating common mode noise from a differential transmission circuit. The noise reduction performance of a common mode choke coil is affected by an inter-wire capacitance between a plurality of conductor wires (a capacitance generated between a pair of conductor wires in different turns). In Japanese Patent Application Publication No. 2014-199904 and Japanese Patent Application Publication No. 2014-120730, it is disclosed that the area in which the conductor wire is wound is divided into two parts, and the conductor wire is wound so as to balance the inter-wire capacitances in the one part and the other part, thereby to improve the noise reduction performance of the common mode choke coil.

However, the arrangement of conductor wires in the conventional wire-wound coil components is restricted strictly since the inter-wire capacitances have to be balanced to improve the noise reduction performance. If conductor wires are arranged so as not to conform to the restriction, a desired noise reduction performance cannot be obtained. Therefore, it is desired to improve the noise reduction performance by reducing the inter-wire capacitance itself.

SUMMARY

One object of the present invention is to provide a wire-wound coil component and a drum core that generate less inter-wire capacitance. Other objects of the present invention will be made apparent through description in the entire specification.

A coil component according to an embodiment of the present invention comprises: a drum core including: a winding core extending along a front-rear direction; a first flange provided on a front end of the winding core; and a second flange provided on a rear end of the winding core; a first conductor wire wound around the winding core of the drum core; and a second conductor wire wound on an outer side of the first conductor wire in a direction orthogonal to the front-rear direction, wherein turns of a same number of the first conductor wire and the second conductor wire contact with each other, while turns of different numbers of the first conductor wire and the second conductor wire are separated from each other.

In this coil component, the turns of the same number of the first conductor wire and the second conductor wire contact with each other, while the turns of different numbers of the first conductor wire and the second conductor wire are separated from each other. Accordingly, the inter-wire capacitance generated between the first conductor wire and the second conductor wire can be reduced.

In an embodiment of the present invention, in the front-rear direction, a contact point at which the first flange contacts with the second conductor wire may be positioned on a front side relative to a contact point at which the first flange contacts with the first conductor wire. With this configuration, the second conductor wire is positioned on the front side relative to the first conductor wire, such that the turns of the same number of the first conductor wire and the second conductor wire contact with each other, while the turns of different numbers of the first conductor wire and the second conductor wire are separated from each other. Accordingly, the inter-wire capacitance generated between the first conductor wire and the second conductor wire can be reduced.

In an embodiment of the present invention, the first flange may include: a plate portion extending in the direction orthogonal to the front-rear direction of the winding core; and a projection projecting from the plate portion in the front-rear direction and positioned between the plate portion and the winding core, wherein a dimension of the projection in the front-rear direction may be smaller than radii of the first conductor wire and the second conductor wire, and wherein a first turn of the first conductor wire may contact with the projection, and a first turn of the second conductor wire may contact with the plate portion. With this configuration, the projection causes the second conductor wire to be positioned on the front side relative to the first conductor wire, such that the turns of the same number of the first conductor wire and the second conductor wire contact with each other, while the turns of different numbers of the first conductor wire and the second conductor wire are separated from each other. Accordingly, the inter-wire capacitance generated between the first conductor wire and the second conductor wire can be reduced.

In an embodiment of the present invention, a groove may be provided in a front portion of the winding core so as to extend along at least a part of a circumferential direction around an axis, and a depth of the groove may be equal to or smaller than the radius of the first conductor wire. With this configuration, the groove fixes the position of the first turn of the first conductor wire, and thus the first conductor wire can be wound easily. Accordingly, the coil component can be manufactured more easily.

In an embodiment of the present invention, the first flange may include: a plate portion extending in the direction orthogonal to the front-rear direction of the winding core; and a projection projecting from the plate portion in the front-rear direction and positioned between the plate portion and the winding core, wherein a principal surface of the projection that is continuous to the plate portion and the winding core may be sloped with respect to an axis such that a dimension of the projection in the front-rear direction is larger toward the axis, wherein the principal surface of the projection and the winding core may form a groove extending along a circumferential direction around the axis, wherein a maximum depth of the groove may be equal to or smaller than a radius of the first conductor wire, and wherein a first turn of the first conductor wire may contact with the principal surface of the projection, and a first turn of the second conductor wire may contact with the plate portion. With this configuration, the principal surface of the projection is sloped with respect to the axis, and therefore, the second conductor wire is positioned on the front side relative to the first conductor wire. Thus, the turns of the same number of the first conductor wire and the second conductor wire contact with each other, while the turns of different numbers of the first conductor wire and the second conductor wire are separated from each other. Accordingly, the inter-wire capacitance generated between the first conductor wire and the second conductor wire can be reduced.

In an embodiment of the present invention, the first flange may include: a plate portion extending in the direction orthogonal to the front-rear direction of the winding core; and a projection projecting from the plate portion in the front-rear direction and positioned between the plate portion and the winding core, wherein a principal surface of the projection that is continuous to the plate portion and the winding core may be sloped with respect to an axis such that a dimension of the projection in the front-rear direction is larger toward the axis, wherein as viewed from the direction orthogonal to the front-rear direction, the angle of slope of the principal surface with respect to the axis may be greater than 60° and smaller than 90°, and wherein first turns of the first conductor wire and the second conductor wire may both contact with the projection. With this configuration, the projection is sloped with respect to the axis, and therefore, the turns of the same number of the first conductor wire and the second conductor wire contact with each other, while the turns of different numbers of the first conductor wire and the second conductor wire are separated from each other. Accordingly, the inter-wire capacitance generated between the first conductor wire and the second conductor wire can be reduced.

In an embodiment of the present invention, a start point of first turns of the first conductor wire and the second conductor wire may be at a position in a circumferential direction at which the first conductor wire contacts with the winding core and the first conductor wire contacts with the second conductor wire.

In an embodiment of the present application, the first flange and the second flange may have substantially the same configuration. In this configuration, the front portion and the rear portion of the drum core are symmetrical, and therefore, there is no need of checking the direction of the drum core in winding the first conductor wire and the second conductor wire. Accordingly, the coil component can be manufactured more easily.

An embodiment of the present invention relates to a circuit board comprising any one of the above coil components. An embodiment of the present invention relates to an electronic device comprising the above circuit board.

A drum core according to an embodiment of the present invention is a drum core having a first conductor wire and a second conductor wire wound thereon, the second conductor wire being positioned on an outer side of the first conductor wire, the drum core comprising: a winding core extending in a front-rear direction; a first flange provided on a front end of the winding core; and a second flange provided on a rear end of the winding core, wherein when the first conductor wire and the second conductor wire are wound, a contact point at which the first flange contacts with the second conductor wire is positioned on a front side relative to a contact point at which the first flange contacts with the first conductor wire.

When the first conductor wire and the second conductor wire are wound on the drum core, a contact point at which the first flange contacts with the second conductor wire is positioned on a front side relative to a contact point at which the first flange contacts with the first conductor wire. Therefore, the second conductor wire is positioned on the front side relative to the first conductor wire, such that the turns of the same number of the first conductor wire and the second conductor wire contact with each other, while the turns of different numbers of the first conductor wire and the second conductor wire are separated from each other. Accordingly, with this drum core, the inter-wire capacitance generated between the first conductor wire and the second conductor wire can be reduced.

Advantages

The present invention is a wire-wound coil component and a drum core that generate less inter-wire capacitance.

DESCRIPTION OF THE EMBODIMENTS

Various embodiments of the invention will be described hereinafter with reference to the drawings. Elements common to a plurality of drawings are denoted by the same reference signs throughout the plurality of drawings. It should be noted that the drawings do not necessarily appear to an accurate scale for convenience of explanation.

Figure 1:
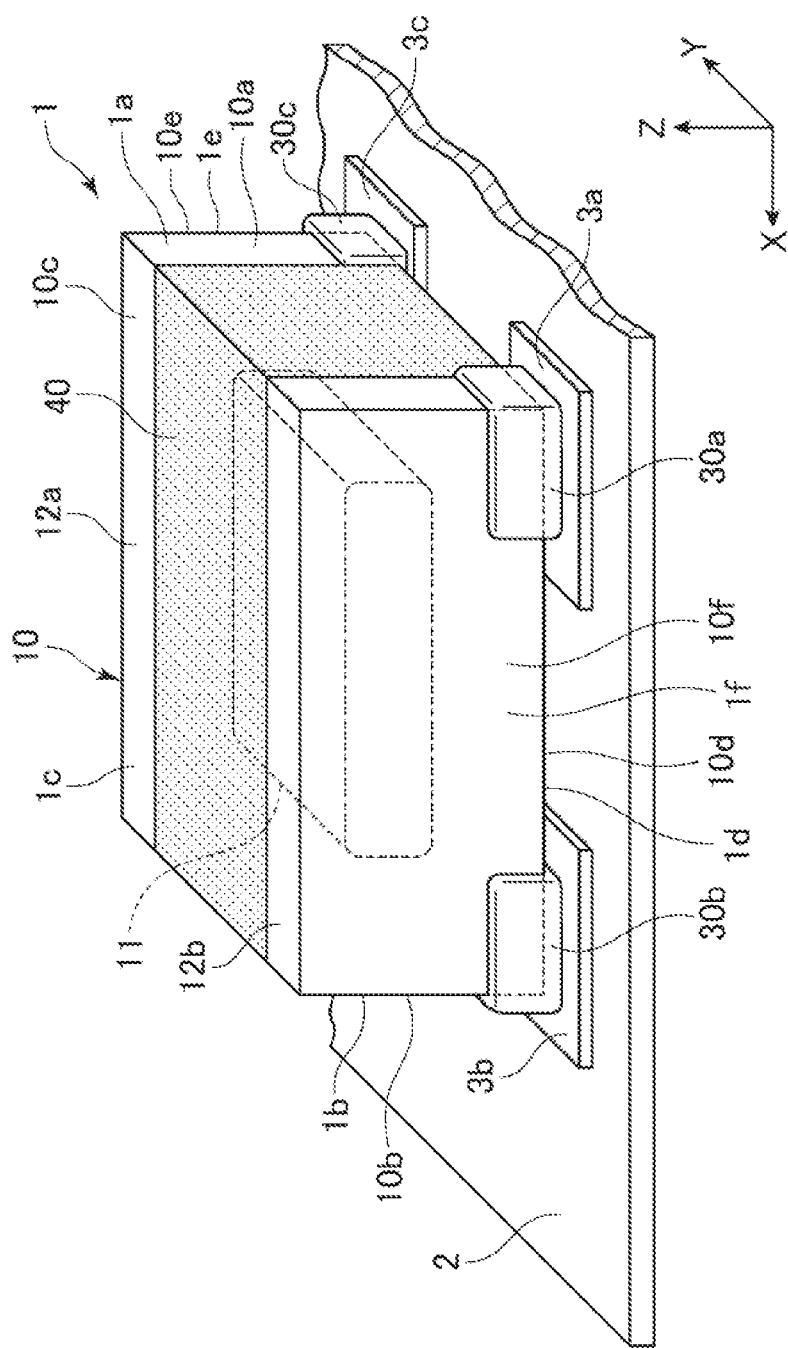
FIG. 1 is a perspective view showing a coil component according to one embodiment of the present invention.
Figure 2:
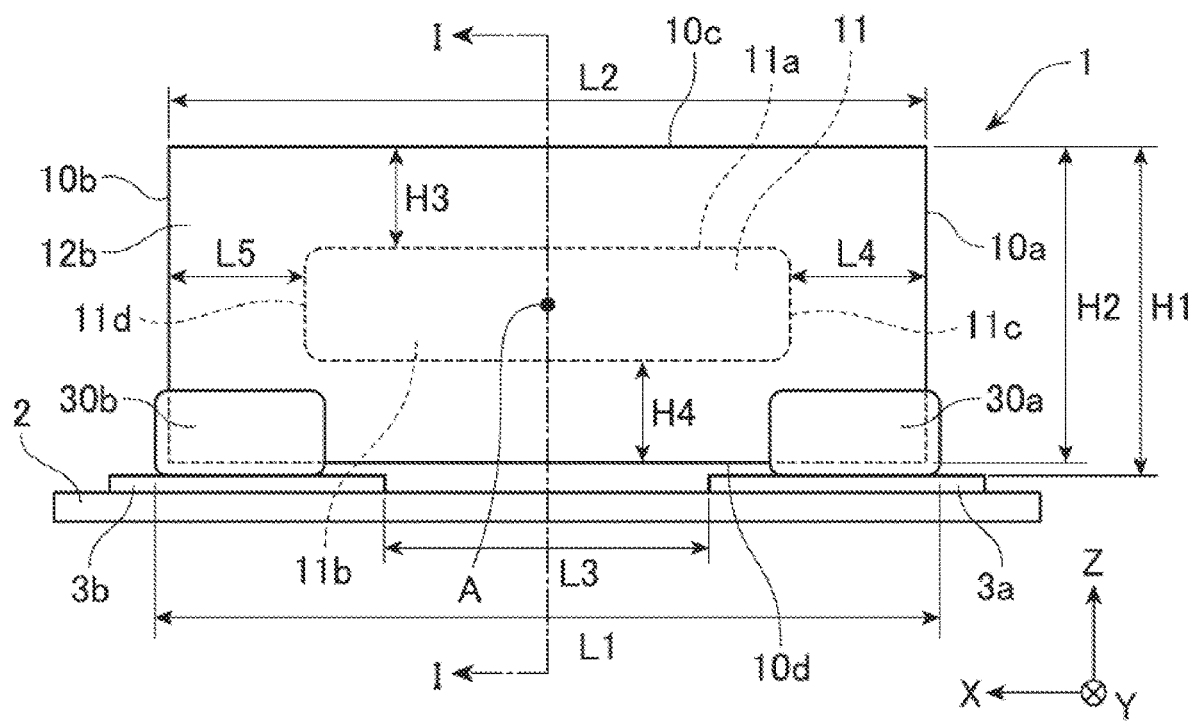
FIG. 2 is a front view of the coil component shown in FIG. 1.
Figure 3:
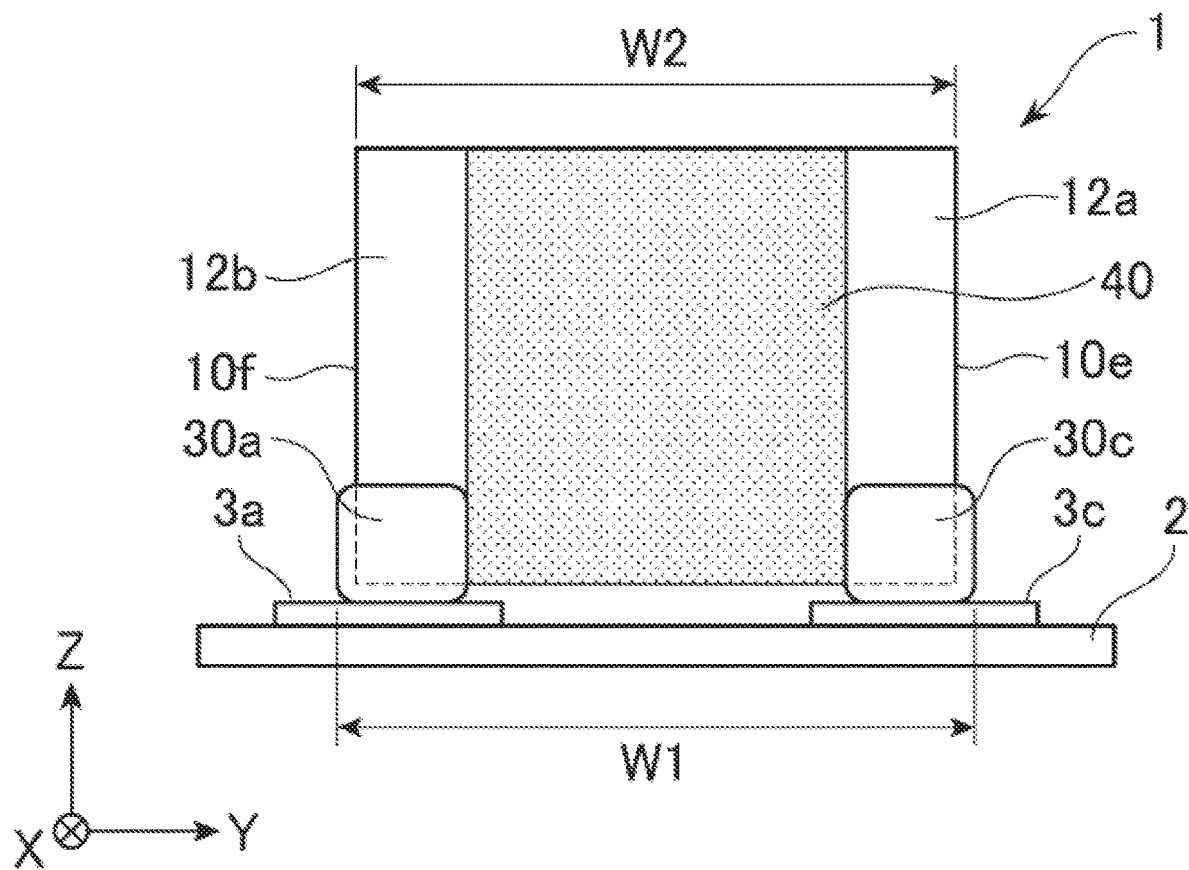
FIG. 3 is a right side view of the coil component shown in FIG. 1.
Figure 4:
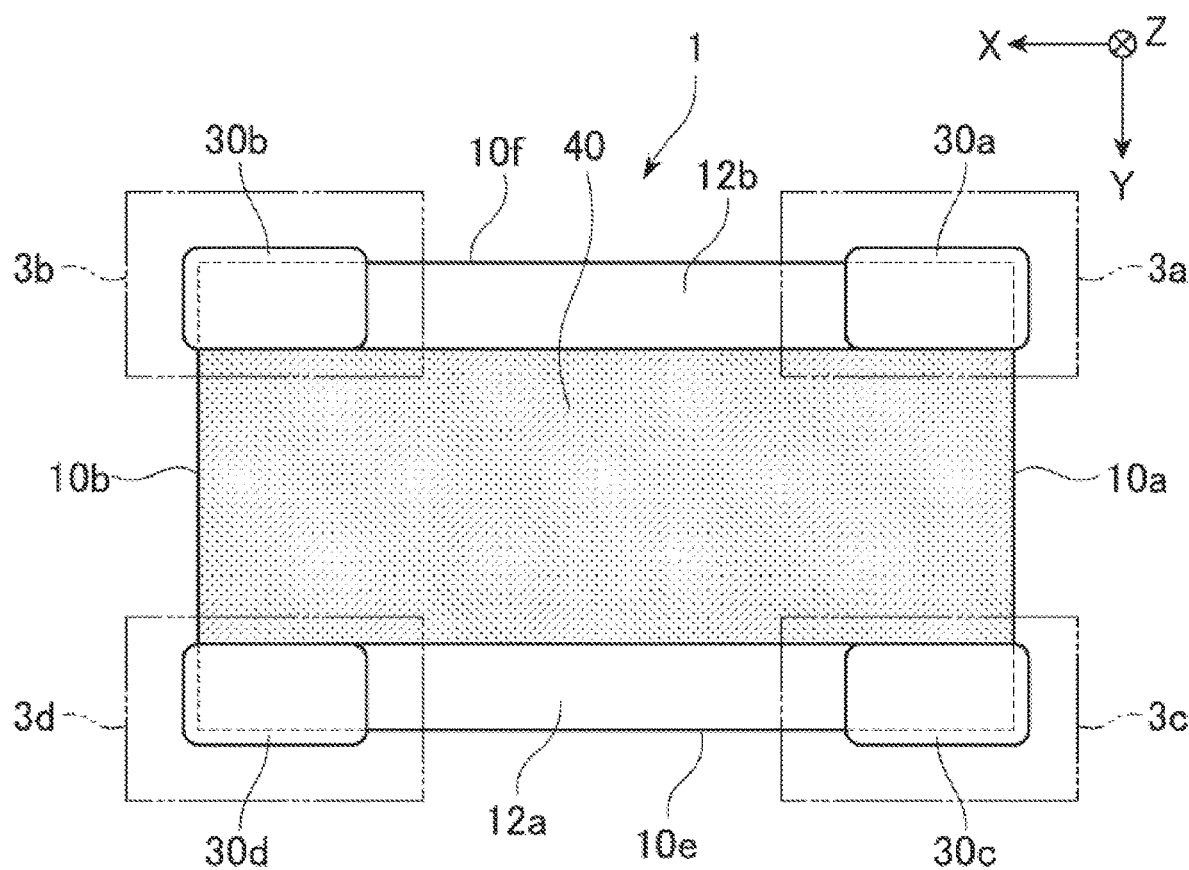
FIG. 4 is a bottom view of the coil component shown in FIG. 1.
Figure 5:
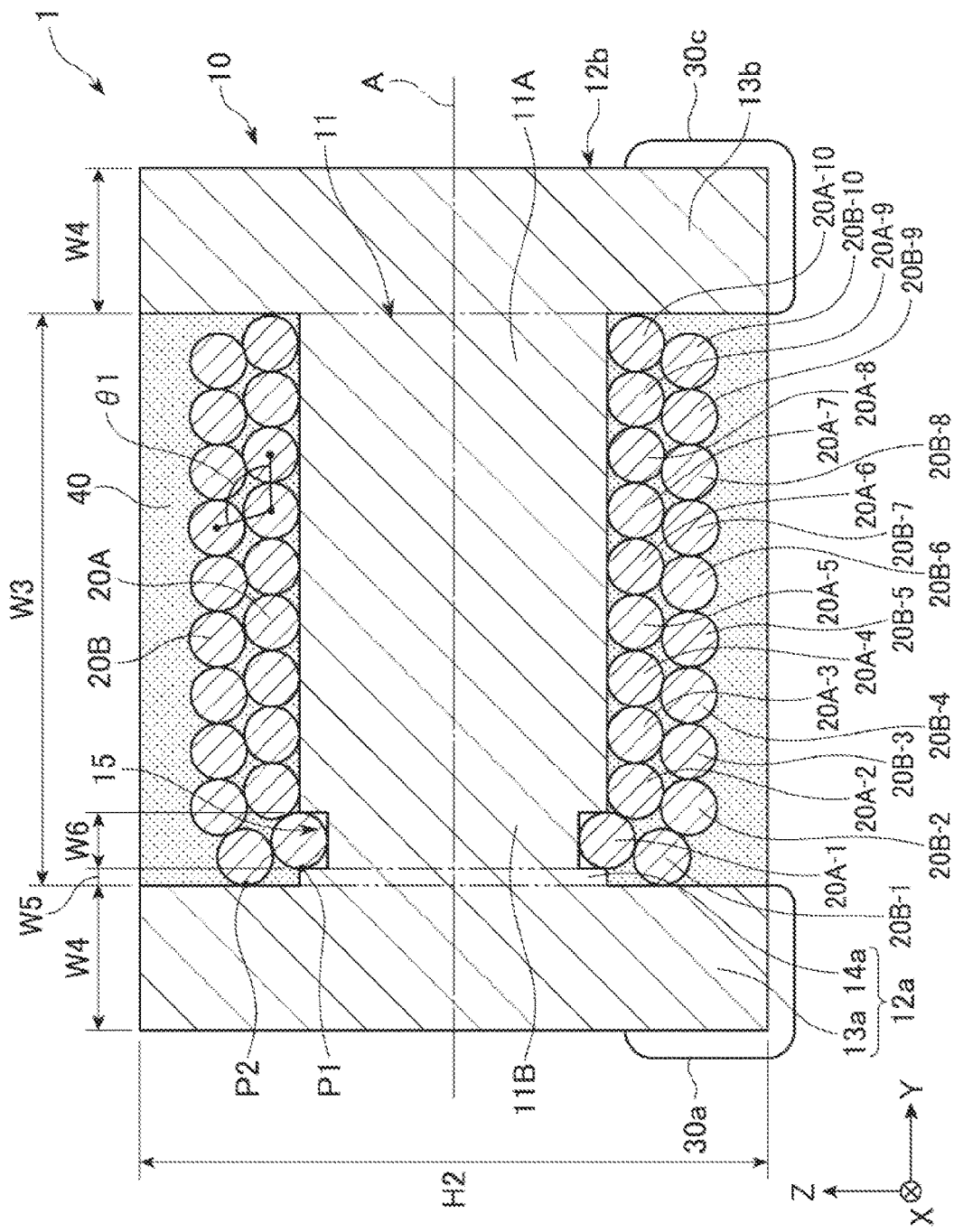
FIG. 5 is a sectional view of the coil component shown in FIG. 2 cut along a plane including the line I-I.

FIG. 1 is a perspective view showing a coil component according to an embodiment of the present invention; FIG. 2 is a front view of the same; FIG. 3 is a right side view of the same; FIG. 4 is a bottom view of the same; and FIG. 5 is a sectional view of the coil component shown in FIG. 2 cut along a plane including the line I-I.

In the embodiment shown, the coil component 1 has four terminals: an external terminal 30a provided on the end of the flange 12b in the negative direction of the axis X, an external terminal 30b provided on the end of the flange 12b in the positive direction of the axis X, an external terminal 30c provided on the end of the flange 12a in the negative direction of the axis X, and an external terminal 30d provided on the end of the flange 12a in the positive direction of the axis X. The coil component 1 is, for example, an inductor such as a common mode choke coil used to eliminate noise in an electronic circuit. The coil component 1 may be a power inductor built in a power supply line or an inductor used in a signal line.

The coil component 1 is mounted on a circuit board by electrically connecting the external terminals 30a to 30d to a first land portion 3a, a second land portion 3b, a third land portion 3c, and a fourth land portion 3d, respectively, each provided on the circuit board. The circuit board can be installed in various electronic devices. Examples of an electronic device including the circuit board on which the coil component 1 is mounted include a smartphone, a mobile phone, a tablet terminal, a game console, and any other electronic device that can include the circuit board on which the coil component 1 is mounted.

FIG. 1 shows a direction X, a direction Y, and a direction Z orthogonal to one another. Herein, orientations and arrangements of constituent members of the coil component 1 may be described based on the direction X, the direction Y, and the direction Z shown in FIG. 1. More specifically, the direction in which the axis A of the winding core 11 extends is the direction Y, and the direction perpendicular to the axis A of the winding core 11 and parallel to the mounting surface of the circuit board 2 is the direction X. Furthermore, a direction orthogonal to the direction X and the direction Y is defined as the direction Z. Herein, the direction X may be referred to as a length direction of the coil component 1, the direction Y may be referred to as a width direction of the coil component 1, and the direction Z may be referred to as a height direction of the coil component 1.

The coil component 1 according to one embodiment of the present invention has a rectangular parallelepiped shape. The coil component 1 has a first end surface 1a, a second end surface 1b, a first principal surface 1c (a top surface 1c), a second principal surface 1d (a bottom surface 1d), a first side surface 1e, and a second side surface 1f. More specifically, the first end surface 1a is an end surface of the coil component 1 in the negative direction of the axis X, the second end surface 1b is an end surface of the coil component 1 in the positive direction of the axis X, the first principal surface 1c is an end surface of the coil component 1 in the positive direction of the axis Z, the second principal surface 1d is an end surface of the coil component 1 in the negative direction of the axis Z, the first side surface 1e is an end surface of the coil component 1 in the positive direction of the axis Y, and the second side surface 1f is an end surface of the coil component 1 in the negative direction of the axis Y.

Each of the first end surface 1a, the second end surface 1b, the first principal surface 1c, the second principal surface 1d, the first side surface 1e, and the second side surface 1f of the coil component 1 may be a flat surface or a curved surface. Furthermore, eight corners of the coil component 1 may be rounded. In this way, even when a part of the first end surface 1a, the second end surface 1b, the first principal surface 1c, the second principal surface 1d, the first side surface 1e, and the second side surface 1f of the coil component 1 is curved or the corners of the coil component 1 are rounded, the shape of the coil component 1 may be herein referred as to as "a rectangular parallelepiped shape." That is, a "rectangular parallelepiped" or a "rectangular parallelepiped shape" described herein is not intended to mean a "rectangular parallelepiped" in a mathematically strict sense.

As shown, the coil component 1 includes a drum core 10, a first conductor wire 20A, a second conductor wire 20B, external electrodes 30a to 30d, and a resin portion 40.

The winding core 11 couples the flange 12a to the flange 12b. More specifically, the winding core 11 couples a projection 14a of the flange 12a to the flange 12b (a planar portion 13b). The flange 12a and the flange 12b are disposed so that respective inner surfaces thereof are opposed to each other. In the flange 12a and the flange 12b, each of the inner surface, an outer surface, and surfaces connecting the inner surface to the outer surface may be a flat surface or a curved surface. Further, the corners may be rounded. In this way, the shape of the coil component 1 may be herein referred to as a "rectangular parallelepiped shape," even when the flange 12a and the flange 12b have a curved surface or when the corners of the flange 12a and flange 12b are rounded. That is, a "rectangular parallelepiped" or a "rectangular parallelepiped shape" described herein is not intended to mean a "rectangular parallelepiped" in a mathematically strict sense.

The outer surface of the flange 12a opposed to the inner surface thereof and the outer surface of the flange 12b opposed to the inner surface thereof each constitute a part of an outer surface of the coil component 1. The flange 12a and the flange 12b may be partially or entirely covered with the resin portion 40. In this case, the outer surface of the resin portion 40 constitutes a part of the outer surface of the coil component. Alternatively, the flange 12a and the flange 12b may be partially covered with a plate core. In this case, a part of the plate core defines the outer surface of the coil component 1. The plate core may be, for example, a plate-shaped member formed of a Ni—Zn ferrite material and may be bonded to the flange 12a and the flange 12b with an epoxy. The permeability (μ) of the plate core is in the range of 400 to 1,000, and is for example 500.

The flange 12a and the flange 12b are configured so that the inner surfaces and the outer surfaces thereof extend in a direction perpendicular to the axis A of the winding core 11. The terms "perpendicular," "orthogonal," and "parallel" used herein are not used in a mathematically strict sense. For example, when it is described that the inner surface of the flange 12a extends in the direction perpendicular to the axis A of the winding core 11, an angle formed by the outer surface of the flange 12a and the axis A of the winding core 11 is 90° or substantially 90°. An angle range of substantially 90° can include any angle value within a range of 70° to 110°, 75° to 105°, 80° to 100°, or 85° to 95°. Likewise, the terms "parallel," "orthogonal," and other words that are included in this specification and can be interpreted in a mathematically strict meaning are also susceptible of wider interpretation than the mathematically strict meanings thereof in light of the purport and context of the present invention and the technical common knowledge.

The drum core 10 has a first end surface 10a, a second end surface 10b, a first principal surface 10c (top surface 10c), a second principal surface 10d (bottom surface 10d), a first side surface 10e, and a second side surface 10f. More specifically, the first end surface 10a is an end surface of the drum core 10 in the negative direction of the axis X, the second end surface 10b is an end surface of the drum core 10 in the positive direction of the axis X, the first principal surface 10c is an end surface of the drum core 10 in the positive direction of the axis Z, the second principal surface 10d is an end surface of the drum core 10 in the negative direction of the axis Z, the first side surface 10e is an end surface of the drum core 10 in the positive direction of the axis Y, and the second side surface 10f is an end surface of the drum core 10 in the negative direction of the axis Y. The first end surface 10a, the second end surface 10b, the first principal surface 10c, the second principal surface 10d, the first side surface 10e, and the second side surface 10f constitute part of the first end surface 1a, the second end surface 1b, the first principal surface 1c, the second principal surface 1d, the first side surface 1e, and the second side surface 1f of the coil component 1, respectively.

The drum core 10 is made of a magnetic material or a non-magnetic material. The magnetic material used for the drum core 10 is, for example, ferrite or a soft magnetic alloy material. The non-magnetic material used for the drum core 10 is, for example, alumina or glass. The magnetic material used for the drum core 10 may be various crystalline or amorphous magnetic alloy materials, or a combination of a crystalline material and an amorphous material. The crystalline magnetic alloy material used as a magnetic material for the drum core 10 is composed mainly of Fe for example, and contains one or more elements selected from the group consisting of Si, Al, Cr, Ni, Ti, and Zr. The amorphous magnetic alloy material used as a magnetic material for the drum core 10 contains, for example, B or C, in addition to any one of Si, Al, Cr, Ni, Ti, and Zr. The magnetic material used for the drum core 10 may be a pure iron composed of Fe and inevitable impurities. The magnetic material used for the drum core 10 may be a combination of the pure iron composed of Fe and inevitable impurities and various crystalline or amorphous magnetic alloy materials. For example, Ni—Zn ferrite may be used to improve the insulation quality. In particular, use of Ni—Zn ferrite ensures the insulation quality between external electrodes, making it possible to reduce the distance between the external electrodes and thus downsize the coil component 1. The materials of the drum core 10 are not limited to those explicitly named herein, and any material known as a material for a drum core can be used.

The drum core 10 is produced by, for example, mixing powder of the magnetic material or the non-magnetic material described above with a lubricant, filling the mixed material into a cavity of a mold, pressing the mixed material to prepare a green compact, and sintering the green compact. Further, the drum core 10 can also be produced by mixing the powder of the magnetic material or the non-magnetic material described above with a resin, a glass, or an insulating oxide (e.g., Ni—Zn ferrite or silica), molding the mixed material, and hardening or sintering the mixed material.

The winding core 11 has the first conductor wire 20A and the second conductor wire 20B wound therearound. The first conductor wire 20A and the second conductor wire 20B are formed by applying an insulation coating around a conductor wire made of a metal material having excellent electrical conductivity. The metal material used for the first conductor wire 20A and the second conductor wire 20B is, for example, one or more of Cu (copper), Al (aluminum), Ni (nickel), and Ag (silver) or an alloy containing any of these metals.

At least one of the flange 12a and the flange 12b has external electrodes provided on both ends thereof in the direction of the axis X. The external electrodes may be either provided on both the flange 12a and the flange 12b or provided only on one of them (only on the flange 12a or only on the flange 12b). FIG. 1 shows an example in which the external electrodes are provided on both the flange 12a and the flange 12b.

In an embodiment of the present invention, the flange 12a and the flange 12b are configured such that the length L2 of these flanges in the direction of the axis X (that is, the length of the long sides of the principal surface 1c and the principal surface 1d) is larger than the distance L3 between the land portions 3a, 3c and the land portions 3b, 3d. Thus, the external electrodes 30a-30d provided on the ends of the flange 12a and the flange 12b in the direction of the axis X can be arranged at positions that correspond to the land portions 3a-3d in a plan view.

More specifically, in the example shown in FIG. 1, the external electrode 30c provided on the ends of the flange 12a in the negative direction of the axis X is disposed at a position that corresponds to the land portion 3c in a plan view, and the external electrode 30d provided on the ends of the flange 12a in the positive direction of the axis X is disposed at a position that corresponds to the land portion 3d in a plan view. The external electrode 30a provided on the ends of the flange 12b in the negative direction of the axis X is disposed at a position that corresponds to the land portion 3a in a plan view, and the external electrode 30b provided on the ends of the flange 12b in the positive direction of the axis X is disposed at a position that corresponds to the land portion 3b in a plan view.

In an embodiment of the present invention, the coil component 1 is mounted to the circuit board 2 by joining the external electrodes 30a-30d to the land portions 3a-3d, respectively. The external electrodes 30a-30d are joined with solder to the land portions 3a-3d, respectively. Thus, the external electrodes 30a-30d are electrically connected to the land portions 3a-3d, respectively.

In an embodiment of the present invention, the external electrode 30a covers the following portions of the drum core 10: the corner of the bottom surface 10d in the negative direction of the axis X and the negative direction of the axis Y, a region in the end surface 10a below a predetermined level, and a region in the end of the side surface 10f in the negative direction of the axis X below a predetermined level. The external electrode 30b covers the following portions of the drum core 10: the corner of the bottom surface 10d in the positive direction of the axis X and the negative direction of the axis Y, a region in the end surface 10b below a predetermined level, and a region in the end of the side surface 10f in the positive direction of the axis X below a predetermined level. The external electrode 30c covers the following portions of the drum core 10: the corner of the bottom surface 10d in the negative direction of the axis X and the positive direction of the axis Y, a region in the end surface 10a below a predetermined level, and a region in the end of the side surface 10e in the negative direction of the axis X below a predetermined level. The external electrode 30d covers the following portions of the drum core 10: the corner of the bottom surface 10d in the positive direction of the axis X and the positive direction of the axis Y, a region in the end surface 10b below a predetermined level, and a region in the end of the side surface 10e in the positive direction of the axis X below a predetermined level.

The shape and arrangement of the external electrodes 30a-30d shown are merely illustrative, and the external electrodes 30a-30d can be variously shaped and arranged.

The resin portion 40 is formed by filling a resin between the flange 12a and the flange 12b. The resin portion 40 covers at least a part of the conductor wires 20A and 20B. For example, the resin portion 40 may cover only the upper surface portions of the first conductor wire 20A and the second conductor wire 20B, so as to ensure or increase the fixation in mounting. Alternatively, the resin portion 40 may cover only the lower surface portions of the first conductor wire 20A and the second conductor wire 20B (that is, the portions of the first conductor wire 20A and the second conductor wire 20B opposed to the circuit board 2 in mounting), so as to allow the external electrodes 30a-30d to extend onto the resin portion 40. The resin portion 40 is composed of a resin or a resin containing a filler. The resin portion 40 is made of any resin material that is used to cover conductor wires in a wire-wound coil component. The filler is composed of either a magnetic material or a non-magnetic material. The filler is made of ferrite powder, magnetic metal particles, alumina particles, or silica particles so as to lower the coefficient of linear expansion and increase the mechanical strength of the resin portion 40.

The resin portion 40 is formed by, for example, applying the above described resin material to the portion between the flange 12a and the flange 12b by roller transfer, and pre-curing and then shaping the applied resin. The resin portion 40 is also formed by filling the above described resin material into the portion between the flange 12a and the flange 12b by molding, and precuring and then shaping the filled resin material. The resin portion 40 can be formed by various known methods. The resin portion 40 may cover the outside surfaces and the side surfaces of the flange 12a and the flange 12b, in addition to the portion between the flange 12a and the flange 12b.

Instead of the resin portion 40, a covering portion formed of a material other than resins may be provided. The covering portion is made of a metal, a ferrite, other ceramics, or other materials. The covering portion is formed by, for example, providing a foil, a plate, or a composite member thereof made of a metal, a ferrite, other ceramics, or other materials so as to connect between the flange 12a and the flange 12b.

In an embodiment of the present invention, the coil component 1 is configured such that its dimension in the direction X is larger than its dimension in the direction Y. More specifically, the coil component 1 has a length (the dimension in the direction X) L1 of 1.0 to 6.0 mm, a width (the dimension in the direction Y) W1 of 0.5 to 4.5 mm, and a height (the dimension in the direction Z) H1 of 0.45 to 4.0 mm. For a smaller size, the coil component 1 has a length (the dimension in the direction X) L1 of 1.0 to 2.0 mm, a width (the dimension in the direction Y) W1 of 0.5 to 1.6 mm, and a height (the dimension in the direction Z) H1 of 0.45 to 0.85 mm. The coil component 1 may be a so-called chip-like component. When the coil component 1 is a chip-like component, the coil component 1 has dimensions that satisfy L1/W1≥2, for example. In another embodiment, the coil component 1 has dimensions that satisfy W1/H1>1. When the coil component 1 satisfies such relationships, the coil component 1 can satisfy H1≤0.6 mm and can be extremely low-profile. These dimensions are mere examples, and a coil component to which the present invention is applicable can have any dimensions that conform to the purport of the present invention.

In an embodiment of the present invention, the axis A of the winding core 11 is parallel to the direction Y, as described above. Therefore, in an embodiment of the present invention, the winding core 11 extends along the short sides of the principal surface 1c (the principal surface 1d) of the coil component 1.

In an embodiment of the present invention, the drum core 10 has a length (the dimension in the direction X) L2 of 0.9 to 5.9 mm, a width (the dimension in the direction Y) W2 of 0.45 to 4.55 mm, and a height (the dimension in the direction Z) H2 of 0.4 to 3.95 mm.

In an embodiment of the present invention, the length of the winding core 11 of the drum core 10 is 0.15 to 4.25 mm.

The length of the winding core 11 equals to the length W3 between the plate portion 13a of the flange 12a and the plate portion 13b of the flange 12b minus the dimension W4 of the projection 14a in the axial direction.

In one embodiment of the present invention, a dimension (a dimension in the Y direction) W4 of each of the plate portion 13a of the flange 12a and the plate portion 13b of the flange 12b of the drum core 10 in a direction parallel to the axis A of the winding core 11 is 0.15 to 1.00 mm. In an embodiment of the present invention, the height of the flange 12a and the flange 12b (the dimension in the direction perpendicular to the mounting surface of the circuit board 2) is equal to the height of the drum core 10 and is 0.4 to 3.95 mm. For a smaller size, the dimension W4 of the plate portion 13a of the flange 12a and the plate portion 13b of the flange 12b of the drum core 10 in the direction parallel to the axis A of the winding core 11 (the dimension in the direction Y) is 0.15 to 0.25 mm. In an embodiment of the present invention, the height of the flange 12a and the flange 12b (the dimension in the direction perpendicular to the mounting surface of the circuit board 2) is equal to the height of the drum core 10 and is 0.4 to 0.8 mm.

In one embodiment of the present invention, the flange 12a and the flange 12b are each configured so that the thickness (the height) H2 thereof in the Z-axis direction is larger than the thickness W4 thereof in the direction parallel to the axis A of the winding core A.

The coil component 1 according to an embodiment of the present invention is configured such that the length W3 between the plate portion 13a of the flange 12a and the plate portion 13b of the flange 12b is smaller than the distance L3 between the land portions 3a, 3c and the land portions 3b, 3d.

The dimensions of the parts of the drum core described above are mere examples, and a drum core used in a coil component to which the present invention is applicable can have any dimensions that conform to the purport of the present invention.

In an embodiment of the present invention, the winding core 11 is formed such that its axis A extends through the centers of the flange 12a and the flange 12b in the direction X and the direction Z and the winding core 11 has a shape symmetrical with respect to the axis A. In an embodiment of the present invention, the winding core 11 and the flange 12b are configured such that the distance H3 between the upper surface 11a of the outer periphery of the winding core 11 and the top surface 10c of the drum core 10 (that is, the top surface of the flange 12b) is equal to or smaller than the distance H4 between the lower surface 11b of the outer periphery of the winding core 11 and the bottom surface 10d of the drum core 10 (that is, the bottom surface of the flange 12b), and the distance L4 between the side surface 11c of the outer periphery of the winding core 11 and the end surface 10a of the drum core 10 (that is, one of the end surfaces of the flange 12b) is equal to the distance L5 between the side surface 11d of the outer periphery of the winding core 11 and the end surface 10b of the drum core 10 (that is, the other of the end surfaces of the flange 12b). The flange 12a may be configured in the same manner as the flange 12b. When the outer diameter of the winding core 11 is uneven in the direction of the axis A, the distance H3 between the upper surface 11a of the outer periphery of the winding core 11 and the top surface 10c of the drum core 10 (that is, the top surface of the flange 12b) refers to the height from the outer periphery of the winding core 11 at the middle of the winding core 11 in the direction of the axis to the top surface 10c of the drum core 10 (that is, the top surface of the flange 12b). Likewise, the distances H4, L4, and L5 are also determined on the basis of the outer periphery at the middle of the winding core 11 in the direction of the axis A.

In an embodiment of the present invention, the winding core 11 is formed such that the distance H3 between the upper surface 11a of the outer periphery of the winding core 11 and the top surface 10c of the drum core 10 is equal to the distance L4 between the side surface 11c of the outer periphery of the winding core 11 and the end surface 10a of the drum core 10.

The arrangement of the drum core 10, the first conductor wire 20A, and the second conductor wire 20B will now be described with reference to FIG. 5. FIG. 5 shows a section of the coil component 1 at a position where both the first conductor wire 20A and the second conductor wire 20B contact with the flange 12a. In other words, FIG. 5 shows a section cut along a plane extending through a point of contact P1 between the first conductor wire 20A and the flange 12a, a point of contact P2 between the second conductor wire 20B and the flange 12a, and the axis A. As shown in FIG. 5, the drum core 10 includes a winding core 11 extending in the front-rear direction, the flange 12a provided on the front end of the winding core 11, and the flange 12b provided on the rear end of the winding core 11. The front-rear direction is herein the same as the axial direction and is parallel to the mounting surface of the circuit board 2. The frontward direction of the front-rear direction is identical to the negative direction of the axis Y, and the rearward direction of the front-rear direction is identical to the positive direction of the axis Y. The flange 12a includes the plate portion 13a and the projection 14a. The plate portion 13a has a rectangular parallelepiped shape and extends in the direction orthogonal to the axial direction of the winding core 11 (that is, the direction along the XZ plane). The projection 14a projects from the plate portion 13a in the axial direction and is continuous to the winding core 11. In the embodiment, the projection 14a has, for example, a rectangular plate-like shape as viewed from the axial direction. The flange 12b does not include a projection and is constituted by the plate portion 13b having a rectangular parallelepiped shape.

The dimension W5 of the projection 14a in the axial direction (that is, the width of the projection 14a) is smaller than the radii of the first conductor wire 20A and the second conductor wire 20B. Further, a groove 15 is provided in the portion of the winding core 11 of the drum core 10 on the negative direction side of the axis Y (the front side) so as to extend along at least a part of the circumferential direction around the axis. In the embodiment of FIG. 5, the groove 15 extends for the entire circumference. It is also possible that the groove 15 extends for a partial circumference. The winding core 11 includes a body portion 11A and a small-diameter portion 11B. The body portion 11A is continuous to the flange 12b, and the small-diameter portion 11B is continuous to the projection 14a of the flange 12a. In the direction orthogonal to the axial direction, the dimension of the small-diameter portion 11B is smaller than the dimension of the body portion 11A. The groove 15 is defined by the side surface of the projection 14a of the flange 12a on the positive direction side of the axis Y, the outer peripheral surface of the small-diameter portion 11B, and the side surface of the body portion 11A on the negative direction side of the axis Y. The groove 15 is disposed at a position corresponding to the first turn of the first conductor wire 20A. In the embodiment, the dimension W6 of the groove 15 in the axial direction (that is, the width of the groove 15) is substantially the same as the diameters of the first conductor wire 20A and the second conductor wire 20B. The depth of the groove 15 is equal to or smaller than the radii of the first conductor wire 20A and the second conductor wire 20B.

The first conductor wire 20A is wound around the winding core 11 of the drum core 10. The second conductor wire 20B is wound around the winding core 11 on the outer side of the first conductor wire 20A for the same number of turns as the first conductor wire 20A. In the coil component 1 shown in FIG. 5, by way of an example, the first conductor wire 20A and the second conductor wire 20B are wound for ten turns. The number of turns of the first conductor wire 20A and the second conductor wire 20B may be from 2 to 50. The diameter of the first conductor wire 20A is substantially the same as the diameter of the second conductor wire 20B. The first turn of the first conductor wire 20A is fitted in the groove 15. The start point of the first conductor wire and the second conductor wire may be herein set at the first of the positions in the circumferential direction at which the first conductor wire 20A contacts with the winding core 11 and the first conductor wire 20A contacts with the second conductor wire 20B after start of winding of the first conductor wire 20A and the second conductor wire 20B. In FIG. 5, the first part of the first conductor wire 20A from the negative direction side of the axis Y is the first turn 20A-1 of the first conductor wire 20A, followed by the second turn 20A-2, the third turn 20A-3, . . . and the tenth turn 20A-10 arranged toward the positive direction side of the axis Y. Likewise, the first part of the second conductor wire 20B from the negative direction side of the axis Y is the first turn 20B-1 of the second conductor wire 20B, followed by the second turn 20B-2, the third turn 20B-3, . . . and the tenth turn 20B-10 arranged toward the positive direction side of the axis Y.

Both the first conductor wire 20A and the second conductor wire 20B contact with the flange 12a. The contact point P2 at which the flange 12a contacts with the second conductor wire 20B is positioned on the axially front side (that is, the negative direction side of the axis Y) relative to the contact point P1 at which the flange 12a contacts with the first conductor wire 20A. More specifically, the first turn of the first conductor wire 20A contacts with the projection 14a of the flange 12a, and the first turn of the second conductor wire 20B contacts with the plate portion 13a of the flange 12a. In this way, the center of the cross-section of the second conductor wire 20B in the first turn thereof is positioned on the negative direction side of the axis Y relative to the center of the cross-section of the first conductor wire 20A in the first turn thereof.

As described above, the drum core 10 includes the projection 14a and the groove 15, and the width W5 of the projection 14a and the depth of the groove 15 are equal to or smaller than the radii of the first conductor wire 20A and the second conductor wire 20B. Therefore, the second conductor wire 20B is positioned on the negative direction side of the axis Y relative to the first conductor wire 20A. Thus, the turns of the same number of the first conductor wire 20A and the second conductor wire 20B contact with each other, while the turns of different numbers of the first conductor wire 20A and the second conductor wire 20B are separated from each other. In other words, as viewed from the direction orthogonal to the axial direction (the direction of the axis X as described herein), the angle θ1 formed by the straight line connecting between the center of the cross-section of the first conductor wire 20A in the n-th turn (n is a natural number) and the center of the cross-section of the first conductor wire 20A in the (n+1)th turn with the straight line connecting between the center of the cross-section of the first conductor wire 20A in the n-th turn and the center of the cross-section of the second conductor wire 20B in the n-th turn is greater than 90° and smaller than 120°. For example, the range of the angle θ1 may also be as follows: 90°<θ1≤105°. In this case, the inter-wire capacitance generated between the first conductor wire 20A and the second conductor wire 20B can be further reduced. The range of the angle θ1 may also be as follows: 95°≤θ1≤100°, 96°≤θ1≤99°, 96.5°≤θ1≤98.5°, or 97°≤θ1≤98°. Further, for example, the range of the angle θ1 may also be as follows: 105°<θ1<120°. In this case, it can be further ensured that the second conductor wire 20B is prevented from being displaced to the axially rear side relative to the turns of the same number of the first conductor wire 20A (toward the positive direction of the axis Y). In particular, when the bending rigidity of the second conductor wire 20B is relatively small, it can be further ensured that the second conductor wire 20B is prevented from being displaced to the axially rear side relative to the turns of the same number of the first conductor wire 20A (toward the positive direction of the axis Y), even if, in winding the second conductor wire 20B, the tension acting on the second conductor wire 20B is diverted to the axially rear side relative to its initial direction (toward the positive direction of the axis Y). The range of the angle θ1 may also be as follows: 110°≤θ1≤115°, 111°≤θ1≤114°, 111.5°≤θ1≤113.5°, or 112°≤θ1≤113°. Further, the range of the angle θ1 may also be as follows: 100°≤θ1≤110°. In this case, the inter-wire capacitance generated between the first conductor wire 20A and the second conductor wire 20B can be further reduced, and the second conductor wire 20B can be prevented from being displaced to the axially rear side relative to the first conductor wire 20A. The range of the angle θ1 may also be as follows: 102°≤θ1≤108°, or 104°≤θ1≤106°.

The above-described comparative relationships in dimensions between the width of the projection 14a and the depth of the groove 15 and between the diameters (or the radii) of the first conductor wire 20A and the second conductor wire 20B are mere examples, and such comparative relationships in dimensions can be modified as desired as long as the above-described positional relationship between the first conductor wire 20A and the second conductor wire 20B is satisfied.

Figure 6:
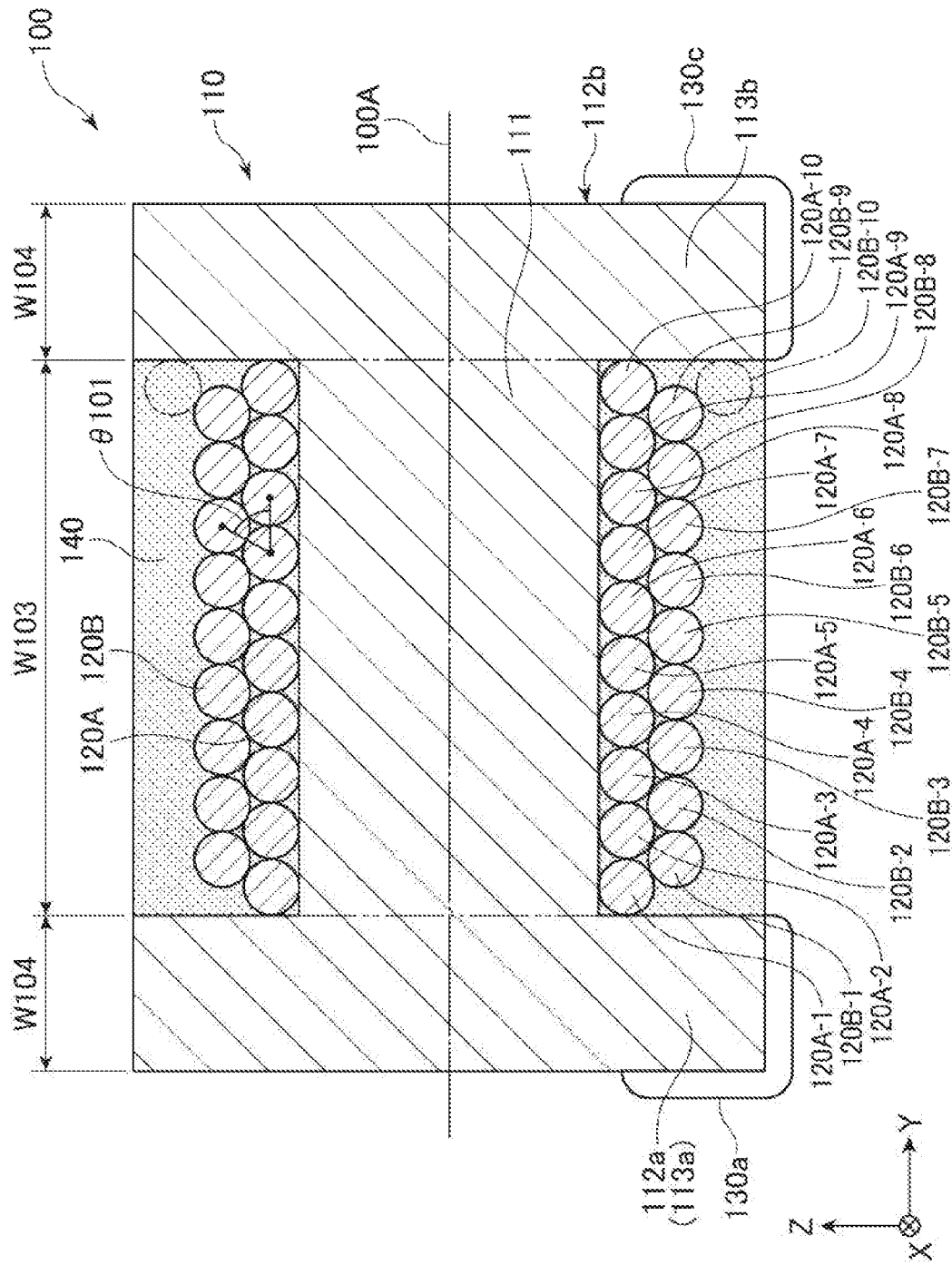
FIG. 6 is a sectional view schematically showing the coil component according to a comparative example.

Advantageous effects of the coil component 1 according to the embodiment will be hereinafter described with reference to FIGS. 5 and 6. FIG. 6 is a sectional view schematically showing a conventional coil component. As shown in FIG. 6, in a coil component 100 according to a comparative example, a flange 112a of a drum core 110 does not include a projection and is constituted by a plate portion 113a only. Thus, only the first conductor wire 120A contacts with the flange 112a in the first turn thereof, and the second conductor wire 120B is separated from the flange 112a in the first turn thereof. The n-th turn of the second conductor wire 120B contacts with both the n-th turn of the first conductor wire 120A and the (n+1)th turn of the first conductor wire 120A. That is, the angle θ101 formed by the straight line connecting between the center of the cross-section of the first conductor wire 120A in the n-th turn and the center of the cross-section of the first conductor wire 120A in the (n+1)th turn with the straight line connecting between the center of the cross-section of the first conductor wire 120A in the n-th turn and the center of the cross-section of the second conductor wire 120B in the n-th turn is about 60°. As described above, in the coil component 100 according to the comparative example, the turns of different numbers of the first conductor wire 120A and the second conductor wire 120B contact with each other, and therefore, a large inter-wire capacitance may be generated between the n-th turn of the second conductor wire 120B and the (n+1)th turn of the first conductor wire 120A, so as to affect the noise reduction performance of the coil component 100.

By contrast, in the coil component 1 according to the embodiment, the contact point P2 at which the flange 12a of the drum core 10 contacts with the second conductor wire 20B is positioned on the negative direction side of the axis Y (the front side) relative to the contact point P1 at which the flange 12a contacts with the first conductor wire 20A. Therefore, the second conductor wire 20B is positioned on the negative direction side of the axis Y relative to the first conductor wire 20A, such that the turns of the same number of the first conductor wire 20A and the second conductor wire 20B contact with each other, while the turns of different numbers of the first conductor wire 20A and the second conductor wire 20B are separated from each other. Thus, the inter-wire capacitance generated between the first conductor wire 20A and the second conductor wire 20B can be reduced. Moreover, in manufacturing the coil component 1, the first conductor wire 20A and the second conductor wire 20B can be arranged as described above only by contacting the first conductor wire 20A and the second conductor wire 20B with the projection 14a of the flange 12a and tightly winding the first conductor wire 20A and the second conductor wire 20B from the negative direction side of the axis Y toward the positive direction side of the axis Y in a sequential order. Therefore, the coil component 1 can be manufactured easily. More specifically, the first conductor wire 20A and the second conductor wire 20B can be arranged as described above by winding the first conductor wire 20A and the second conductor wire 20B in a sequential order such that the n-th turn and the (n+1)th turn of the first conductor wire 20A contact with each other in the axial direction and the n-th turn and the (n+1)th turn of the second conductor wire 20B contact with each other in the axial direction. Accordingly, it is possible to reduce the adverse effect of the inter-wire capacitance, while maintaining the ease of manufacturing.

Further, the groove 15 is provided in the portion of the winding core 11 on the negative direction side of the axis Y so as to extend along the circumferential direction around the axis. The depth of the groove 15 is equal to or smaller than the radii of the first conductor wire 20A and the second conductor wire 20B. Thus, the groove 15 fixes the position of the first turn of the first conductor wire 20A, and the first conductor wire 20A can be wound easily. Accordingly, the coil component 1 can be manufactured more easily.

In the coil component 100 shown in FIG. 6, the n-th turn of the second conductor wire 120B contacts with both the n-th turn of the first conductor wire 120A and the (n+1)th turn of the first conductor wire 120A. Therefore, the tenth turn 120B-10 of the second conductor wire 120B cannot be wound, and the number of turns of the second conductor wire 120B is smaller than that of the first conductor wire 120A by one. By contrast, in the coil component 1 according to the embodiment, the same number of turns of the first conductor wire 20A and the second conductor wire 20B can be wound, resulting in a higher inductance than the coil component 100. Moreover, for the same inductance of the coil component 1 according to the embodiment and the typical conventional coil component 100, the coil component 1 can have a smaller size than the coil component 100.

In the drum core 10 according to the embodiment, the contact point P2 at which the flange 12a contacts with the second conductor wire 20B is positioned on the front side relative to the contact point P1 at which the flange 12a contacts with the first conductor wire 20A. Therefore, the second conductor wire 20B is positioned on the front side relative to the first conductor wire 20A, such that the turns of the same number of the first conductor wire 20A and the second conductor wire 20B contact with each other, while the turns of different numbers of the first conductor wire 20A and the second conductor wire 20B are separated from each other. Moreover, use of the drum core 10 makes it possible to arrange the first conductor wire 20A and the second conductor wire 20B as described above only by contacting the first conductor wire 20A and the second conductor wire 20B with the projection 14a of the flange 12a and tightly winding the first conductor wire 20A and the second conductor wire 20B from the negative direction side of the axis Y toward the positive direction side of the axis Y in a sequential order. Accordingly, it is possible to reduce the adverse effect of the inter-wire capacitance, while maintaining the ease of manufacturing.

Figure 7:
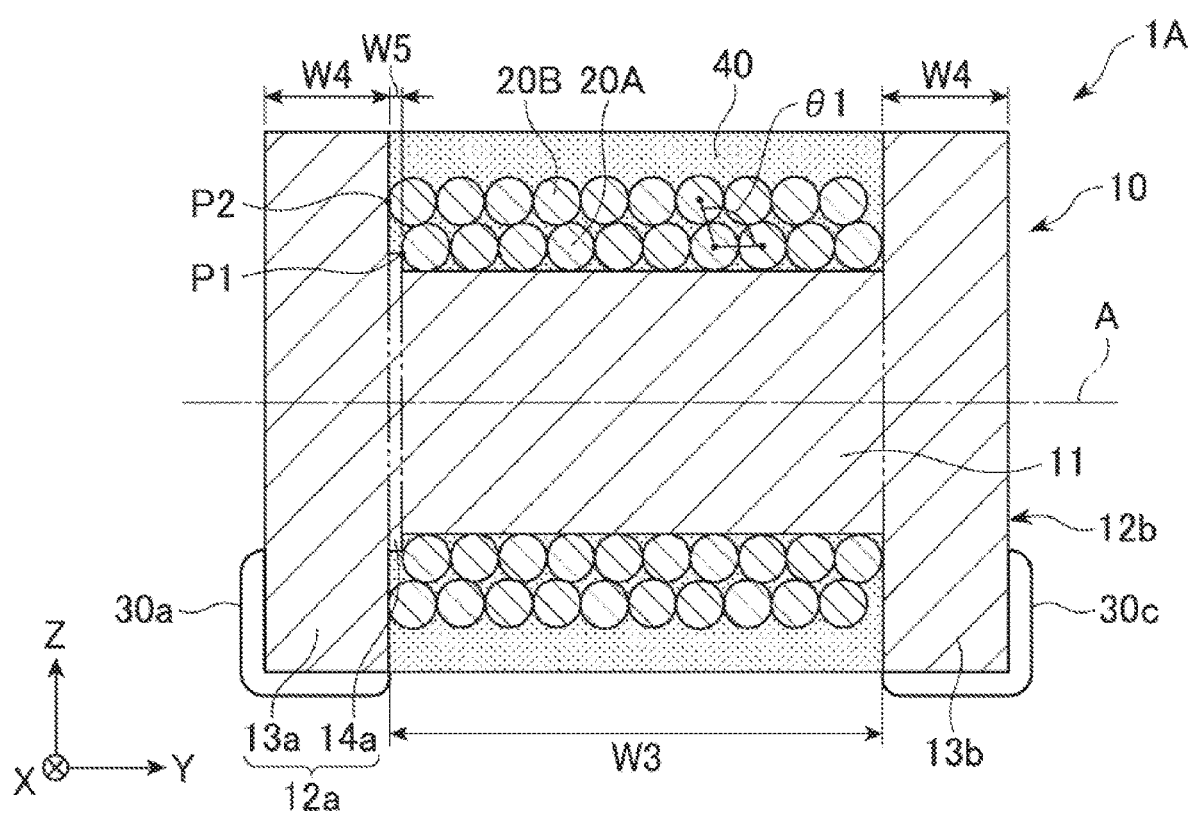
FIG. 7 is a sectional view schematically showing the coil component according to a variation.

Next, a coil component 1A according to a variation will be described with reference to FIG. 7. As shown in FIG. 7, the coil component 1A according to the variation includes the drum core 10, the first conductor wire 20A, the second conductor wire 20B, the external electrodes 30a to 30d, and the resin portion 40. The drum core 10 includes the winding core 11, the flange 12a provided on the front end of the winding core 11, and the flange 12b provided on the rear end of the winding core 11. The flange 12a includes the plate portion 13a and the projection 14a. The coil component 1A is different from the coil component 1 in that the winding core 11 does not have the groove 15.

Since the drum core 10 of the coil component 1A also includes the projection 14a, the contact point P2 at which the flange 12a contacts with the second conductor wire 20B is positioned on the negative direction side of the axis Y (the front side) relative to the contact point P1 at which the flange 12a contacts with the first conductor wire 20A. In other words, the second conductor wire 20B is positioned on the negative direction side of the axis Y relative to the first conductor wire 20A. Thus, the turns of the same number of the first conductor wire 20A and the second conductor wire 20B contact with each other, while the turns of different numbers of the first conductor wire 20A and the second conductor wire 20B are separated from each other. Accordingly, as with the coil component 1, it is possible to reduce the adverse effect of the inter-wire capacitance.

Figure 8:
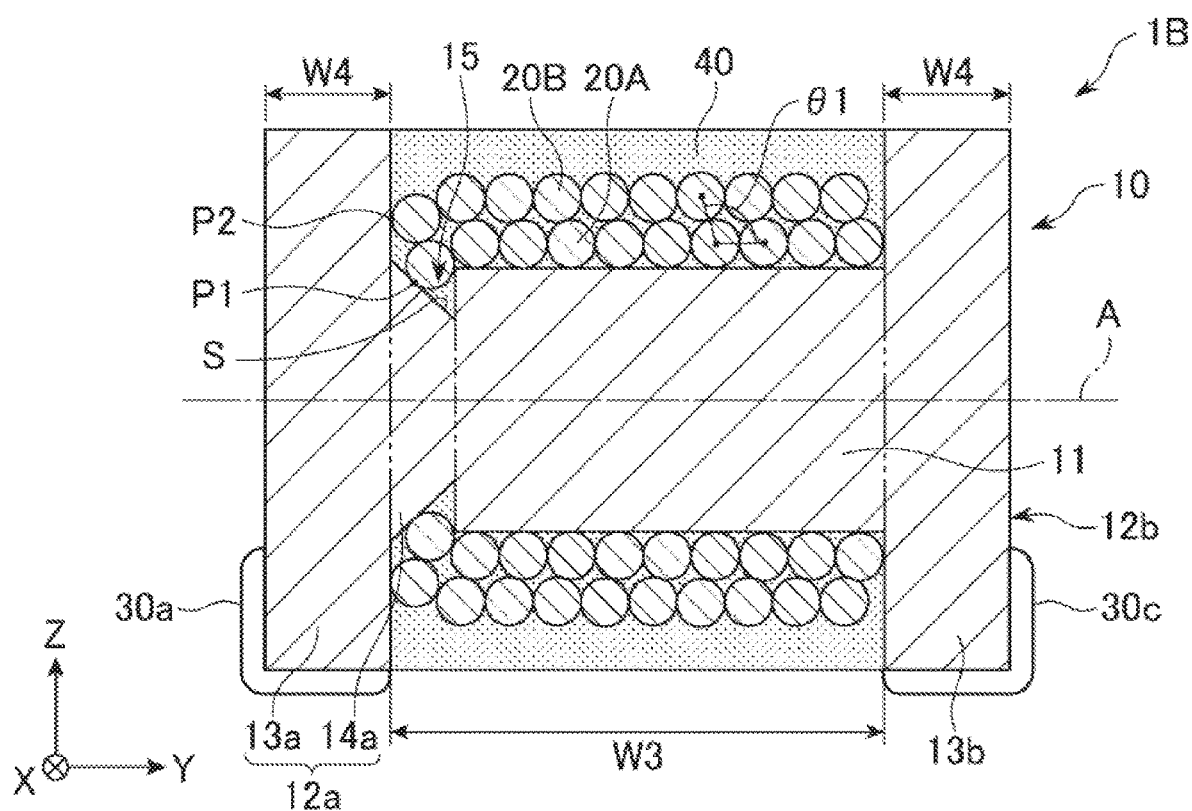
FIG. 8 is a sectional view schematically showing the coil component according to a variation.

Next, a coil component 1B according to a variation will be described with reference to FIG. 8. As shown in FIG. 8, similarly to the coil component 1, the coil component 1B according to the variation includes the drum core 10, the first conductor wire 20A, the second conductor wire 20B, the external electrodes 30a to 30d, and the resin portion 40. The drum core 10 includes the winding core 11, the flange 12a, and the flange 12b. The flange 12a includes the plate portion 13a and the projection 14a. The difference of the coil component 1B from the coil component 1 is that the principal surface S of the projection 14a that is continuous to the plate portion 13a and the winding core 11 is sloped with respect to the axis A. The principal surface S of the projection 14a is sloped such that the dimension of the projection 14a in the axial direction is larger toward the axis A. The end of the projection 14a in the positive direction side of the axis Y has a smaller dimension in the direction orthogonal to the axis A than the end of the winding core 11 in the negative direction side of the axis Y. Thus, the principal surface S of the projection 14a and the winding core 11 form the groove 15 which is substantially V-shaped and extends along the circumferential direction around the axis. The maximum depth of the groove 15 is, for example, equal to or smaller than the radii of the first conductor wire 20A and the second conductor wire 20B. The first turn of the first conductor wire 20A fits in the groove 15 and contacts with the projection 14a, and the first turn of the second conductor wire 20B contacts with the plate portion 13a.

Since the drum core 10 of the coil component 1B also includes the projection 14a and the groove 15, the contact point P2 at which the flange 12a contacts with the second conductor wire 20B is positioned on the negative direction side of the axis Y (the front side) relative to the contact point P1 at which the flange 12a contacts with the first conductor wire 20A. Thus, the turns of the same number of the first conductor wire 20A and the second conductor wire 20B contact with each other, while the turns of different numbers of the first conductor wire 20A and the second conductor wire 20B are separated from each other. Accordingly, the same advantageous effects as with the coil component 1 can be obtained.

Figure 9:
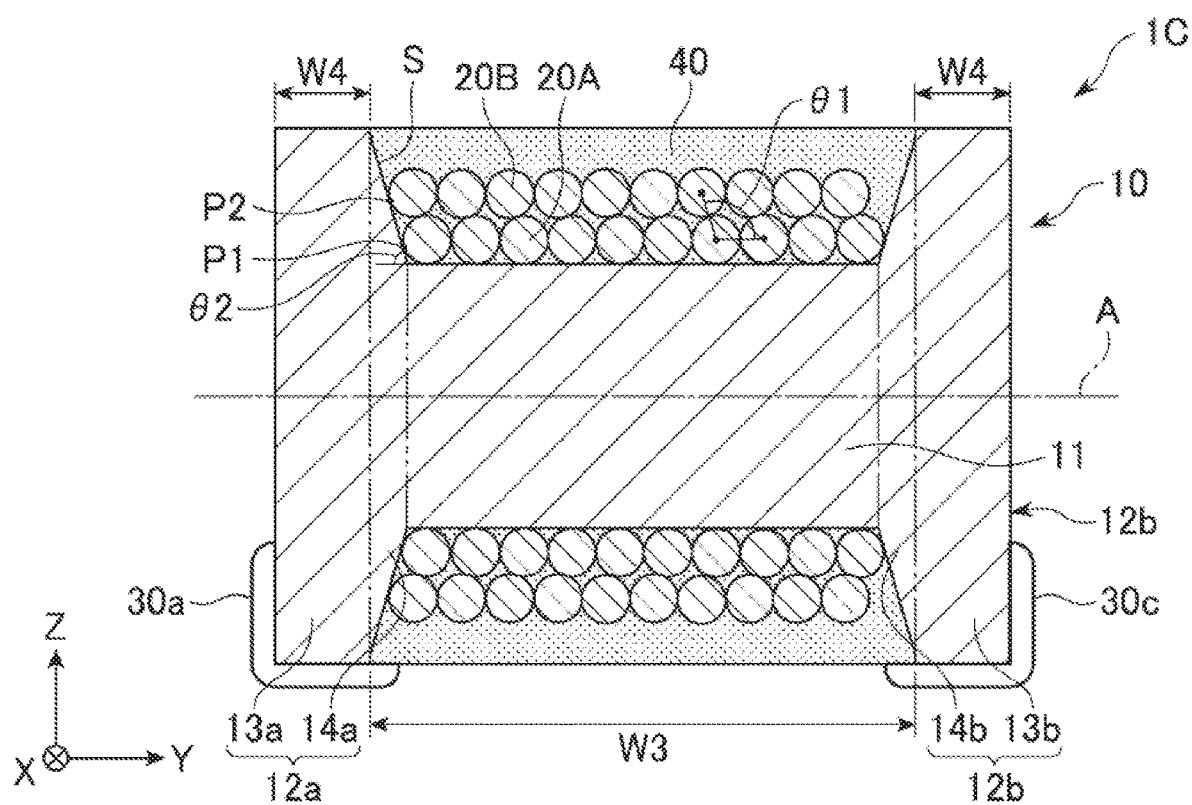
FIG. 9 is a sectional view schematically showing the coil component according to a variation.

Next, a coil component 1C according to a variation will be described with reference to FIG. 9. As shown in FIG. 9, similarly to the drum core 10 of the coil component 1, the drum core 10 of the coil component 1C includes the winding core 11, the flange 12a, and the flange 12b. The flange 12a includes the plate portion 13a and the projection 14a. The difference of the coil component 1C from the coil component 1 is that the principal surface S of the projection 14a that is continuous to the plate portion 13a and the winding core 11 forms an inner surface of the flange 12a and is sloped with respect to the axis A. As viewed from the direction orthogonal to the axial direction (that is, the direction of the axis X or the axis Z), the angle of slope θ2 of the principal surface S with respect to the axis A is greater than 60° and smaller than 90°. The first turns of the first conductor wire 20A and the second conductor wire 20B both contact with the principal surface S.

Since the drum core 10 of the coil component 1C also includes the projection 14a and the groove 15, the contact point P2 at which the flange 12a contacts with the second conductor wire 20B is positioned on the negative direction side of the axis Y (the front side) relative to the contact point P1 at which the flange 12a contacts with the first conductor wire 20A. Thus, the turns of the same number of the first conductor wire 20A and the second conductor wire 20B contact with each other, while the turns of different numbers of the first conductor wire 20A and the second conductor wire 20B are separated from each other. Accordingly, the same advantageous effects as with the coil component 1 can be obtained.

In the coil component 1C, the flange 12b provided on the other end (the end on the positive direction side of the axis Y) of the winding core 11 of the drum core 10 has the same configuration as the flange 12a. More specifically, the flange 12b includes the plate portion 13b and a projection 14b. In this configuration, the front portion and the rear portion of the drum core 10 are symmetrical, and therefore, there is no need of checking the direction of the drum core 10 in winding the first conductor wire 20A and the second conductor wire 20B. Accordingly, the coil component 1C can be manufactured more easily.

Figure 10:
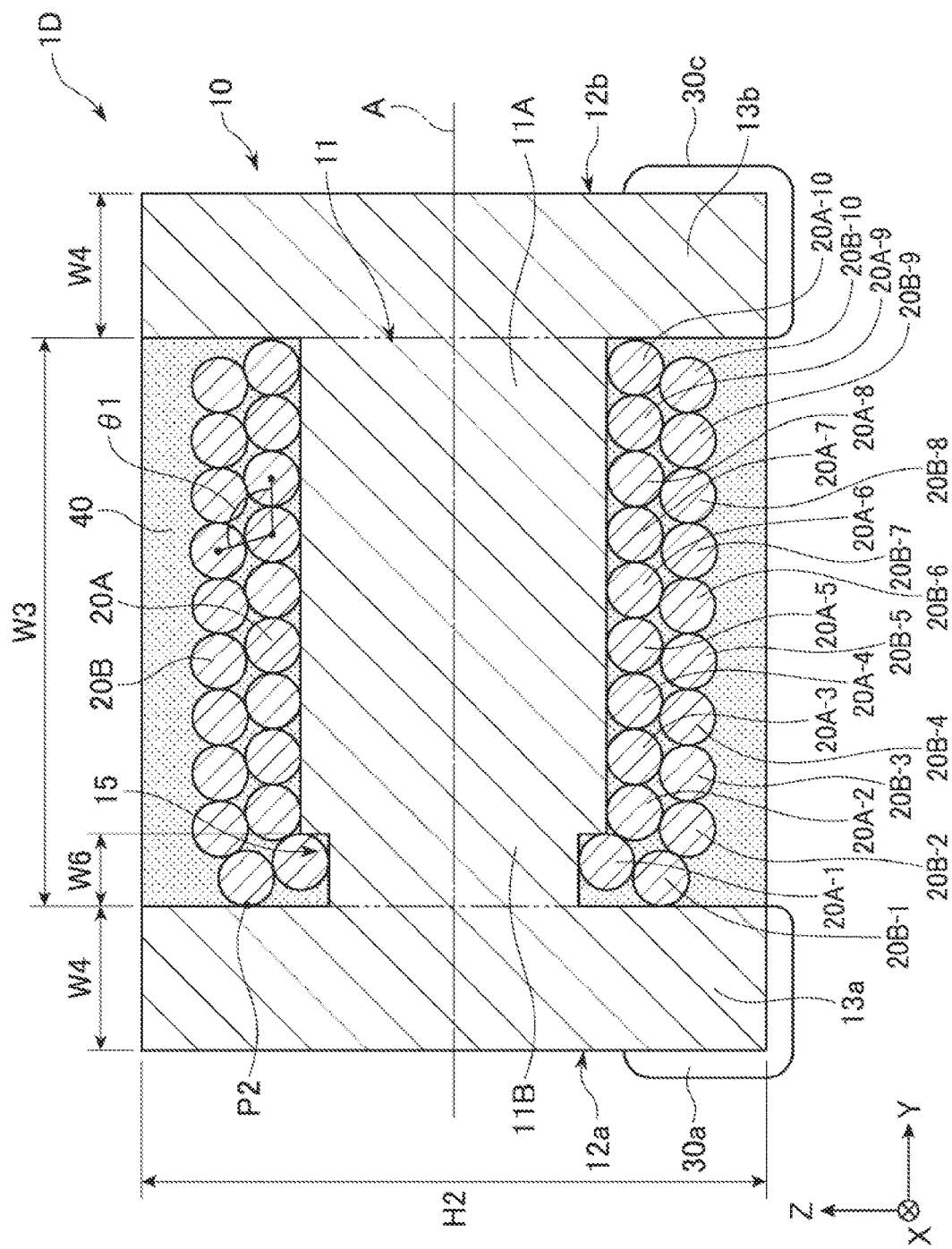
FIG. 10 is a sectional view schematically showing the coil component according to a variation.

Next, a coil component 1D according to a variation will be described with reference to FIG. 10. As shown in FIG. 10, similarly to the drum core 10 of the coil component 1, the drum core 10 of the coil component 1D includes the winding core 11, the flange 12a, and the flange 12b. The coil component 1D is different from the coil component 1 in that the flange 12a does not include a projection and is formed of the plate portion 13a only, and that the width W6 of the groove 15 is larger than the diameter of the first conductor wire 20A and is smaller than 1.5 times the diameter of the first conductor wire 20A.

In the coil component 1D described above, the first conductor wire 20A and the flange 12a are separated from each other, and the first conductor wire 20A and the body portion 11A of the winding core 11 contact with each other. In this way, since the body portion 11A fixes the position of the first conductor wire 20A in the axial direction, and the width W6 of the groove 15 is larger than the diameter of the first conductor wire 20A and is smaller than 1.5 times the diameter of the first conductor wire 20A, the second conductor wire 20B is positioned on the negative direction side of the axis Y relative to the first conductor wire 20A. Thus, the turns of the same number of the first conductor wire 20A and the second conductor wire 20B contact with each other, while the turns of different numbers of the first conductor wire 20A and the second conductor wire 20B are separated from each other. Accordingly, as with the coil component 1, it is possible to reduce the adverse effect of the inter-wire capacitance.

The present invention is not limited to the embodiment described above and is susceptible of various modifications. For example, it is also possible that the flange 12b of the drum core 10 of the coil components 1, 1A, 1B includes the plate portion 13b and the projection 14b.

In the above embodiments, the winding core 11 has a substantially quadrangular prism shape. It is also possible that the winding core 11 has any shape that is suitable for the first conductor wire 20A and the second conductor wire 20B to be wound thereon. In addition, the shapes of the plate portions 13a, 13b of the flanges 12a, 12b that are applicable to the present invention are not limited to a substantially rectangular parallelepiped shape but may be various.

In the above embodiments, the coil components 1, 1A, 1B, 1D are four-terminal common mode choke coils. It is also possible that the coil components 1, 1A, 1B, 1D are two-terminal inductors for a single line, such as a coil component 1F shown in FIG. 11.

Figure 11:
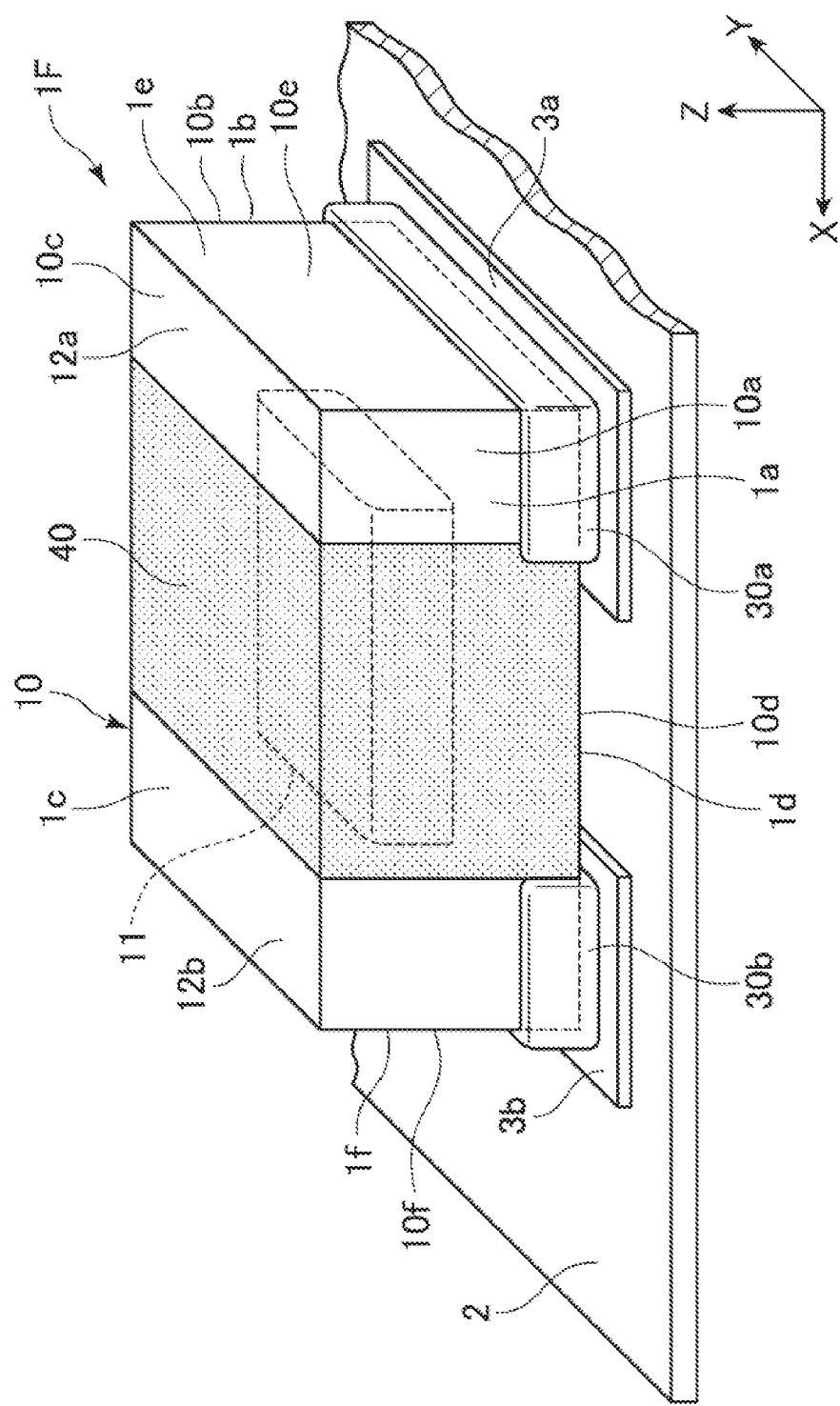
FIG. 11 is a perspective view showing the coil component according to a variation.

It is also possible to use the drum core 10 of the two-terminal coil component 1F shown in FIG. 11, in place of the drum core 10 of the four-terminal coil components 1, 1A, 1B, 1D. In this case, the dimension of the drum core 10 of the coil components 1, 1A, 1B, 1C, 1D in the direction of the axis Y may be larger than that in the direction of the axis X. More specifically, the drum core 10 of the coil components 1, 1A, 1B, 1C, 1D may have dimensions that satisfy L2/W2>1, for example. By way of an example, the dimension L2 of the drum core 10 in the direction of the axis X may be 0.4 mm to 4.4 mm, and the dimension W1 of the drum core 10 in the direction of the axis Y may be 0.9 mm to 5.9 mm.

The dimensions, materials, and arrangements of the constituent elements described herein are not limited to those explicitly described for the embodiments, and these constituent elements can be modified to have any dimensions, materials, and arrangements within the scope of the present invention. Furthermore, constituent elements not explicitly described herein can also be added to the embodiments described, and it is also possible to omit some of the constituent elements described for the embodiments.

What is claimed is:

1. A coil component comprising:
   a drum core including:
   a winding core extending along a front-rear direction;
   a first flange provided on a front end of the winding core; and
   a second flange provided on a rear end of the winding core;
   a first conductor wire wound around the winding core of the drum for two or more turns; and
   a second conductor wire wound on an outer side of the first conductor wire for two or more turns in a direction orthogonal to the front-rear direction,
   wherein the two or more turns of the first conductor wire include a first inner turn and a second inner turn adjacent to the first inner turn along the front-rear direction,
   wherein the two or more turns of the second conductor wire include a first outer turn and a second outer turn adjacent to the first outer turn along the front-rear direction,
   wherein the first inner turn being in contact with the first outer turn and separated from the second outer turn, the first outer turn separated from the second inner turn, and
   wherein as viewed from the direction orthogonal to the front-rear direction, an angle between a first straight line and a second straight line is greater than 90° and smaller than 120°, the first straight line connecting a center of a cross-section of the first inner turn of the first conductor wire with a center of a cross-section of the second inner turn of the first conductor wire, the second straight line connecting the center of the cross-section of the first inner turn of the first conductor wire with a center of a cross-section of the first outer turn of the second conductor wire.

2. The coil component of claim 1 wherein in the front-rear direction, a contact point at which the first flange contacts with the second conductor wire is positioned on a front side relative to a contact point at which the first flange contacts with the first conductor wire.

3. The coil component of claim 1, wherein the first flange includes:
   a plate portion extending in the direction orthogonal to the front-rear direction of the winding core; and
   a projection projecting from the plate portion in the front-rear direction and positioned between the plate portion and the winding core,
   wherein a principal surface of the projection that is continuous to the plate portion and the winding core is sloped with respect to an axis such that a dimension of the projection in the front-rear direction is larger toward the axis,
   wherein the principal surface of the projection and the winding core form a groove extending along a circumferential direction around the axis,
   wherein a maximum depth of the groove is equal to or smaller than a radius of the first conductor wire, and
   wherein a first turn of the first conductor wire contacts with the principal surface of the projection, and a first turn of the second conductor wire contacts with the plate portion.

4. The coil component of claim 1, wherein the first flange includes:
   a plate portion extending in the direction orthogonal to the front-rear direction of the winding core; and
   a projection projecting from the plate portion in the front-rear direction and positioned between the plate portion and the winding core,
   wherein a principal surface of the projection that is continuous to the plate portion and the winding core is sloped with respect to an axis such that a dimension of the projection in the front-rear direction is larger toward the axis, wherein as viewed from the direction orthogonal to the front-rear direction, the angle of slope of the principal surface with respect to the axis is greater than 60° and smaller than 90°, and wherein first turns of the first conductor wire and the second conductor wire both contact with the projection.

5. The coil component of claim 1, wherein the first flange and the second flange have substantially the same configuration.

6. The coil component of claim 1, wherein a start point of first turns of the first conductor wire and the second conductor wire is at a position in a circumferential direction around an axis at which the first conductor wire contacts with the winding core and the first conductor wire contacts with the second conductor wire.

7. A circuit board comprising the coil component according to claim 1.

8. An electronic device comprising the circuit board according to claim 7.

9. A coil component comprising:
a drum core including:
   a winding core extending along a front-rear direction;
   a first flange provided on a front end of the winding core; and
   a second flange provided on a rear end of the winding core;
a first conductor wire wound around the winding core of the drum core; and
a second conductor wire wound on an outer side of the first conductor wire in a direction orthogonal to the front-rear direction,
wherein turns of a same number of the first conductor wire and the second conductor wire contact with each other, while turns of different numbers of the first conductor wire and the second conductor wire are separated from each other,
wherein the first flange includes:
a plate portion extending in the direction orthogonal to the front-rear direction of the winding core; and
a projection projecting from the plate portion in the front-rear direction and positioned between the plate portion and the winding core, wherein a dimension of the projection in the front-rear direction is smaller than radii of the first conductor wire and the second conductor wire, and wherein a first turn of the first conductor wire contacts with the projection, and a first turn of the second conductor wire contacts with the plate portion.

10. The coil component of claim 9,
wherein a groove is provided in a front portion of the winding core so as to extend along at least a part of a circumferential direction around an axis, and
wherein a depth of the groove is equal to or smaller than the radius of the first conductor wire.

11. A drum core having a first conductor wire and a second conductor wire wound thereon, the second conductor wire being positioned on an outer side of the first conductor wire, the drum core comprising:
a winding core extending in a front-rear direction;
a first flange provided on a front end of the winding core; and
a second flange provided on a rear end of the winding core,
wherein when the first conductor wire and the second conductor wire are wound, a contact point at which the first flange contacts with the second conductor wire is positioned on a front side relative to a contact point at which the first flange contacts with the first conductor wire,
wherein the first flange includes a plate portion and a projection, the plate portion extending in a direction orthogonal to the front-rear direction, the projection projecting from the plate portion in the front-rear direction and positioned between the plate portion and the winding core,
wherein a dimension of the projection in the front-rear direction is smaller than radii of the first conductor wire and the second conductor wire, and
wherein a first turn of the first conductor wire contacts with the projection, and a first turn of the second conductor wire contacts with the plate portion.

* * * * *